(12) United States Patent
    Kraus et al.

(10) Patent No.: US 12,651,727 B2
(45) Date of Patent: Jun. 9, 2026

(54) MODULAR MICROWAVE PLASMA SOURCE

(71) Applicant: Applied Materials, Inc., Santa Clara, CA (US)

(72) Inventors: Philip Allan Kraus, San Jose, CA (US); Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 338 days.

(21) Appl. No.: 17/852,086

(22) Filed: Jun. 28, 2022

(65) Prior Publication Data

US 2022/0344131 A1 Oct. 27, 2022

Related U.S. Application Data

(63) Continuation of application No. 16/994,136, filed on Aug. 14, 2020, now Pat. No. 11,404,248, which is a
(Continued)

(51) Int. Cl.
    *H01J 37/32* (2006.01)
    *C23C 16/455* (2006.01)
    *C23C 16/511* (2006.01)

(52) U.S. Cl.
    CPC .. *H01J 37/32192* (2013.01); *C23C 16/45544* (2013.01); *C23C 16/511* (2013.01);
    (Continued)

(58) Field of Classification Search
    CPC .......... H01J 37/32192; H01J 37/32311; C23C 16/511
    See application file for complete search history.

(56) References Cited

U.S. PATENT DOCUMENTS 5,134,965 A    8/1992  Tokuda et al.
5,179,264 A    1/1993  Cuomo et al.
            (Continued)

FOREIGN PATENT DOCUMENTS

CN    101320679 A    12/2008
CN    102089867 A     6/2011
            (Continued)

OTHER PUBLICATIONS

English translation JP 2013171847, Sep. 2, 2013, Fujino (Year: 2013).*
(Continued)

*Primary Examiner* — Keath T Chen
(74) *Attorney, Agent, or Firm* — Schwabe, Williamson & Wyatt, P.C.

(57) ABSTRACT

Embodiments include a modular microwave source. In an embodiment, the modular microwave source comprises a voltage control circuit, a voltage controlled oscillator, where an output voltage from the voltage control circuit drives oscillation in the voltage controlled oscillator. The modular microwave source may also include a solid state microwave amplification module coupled to the voltage controlled oscillator. In an embodiment, the solid state microwave amplification module amplifies an output from the voltage controlled oscillator. The modular microwave source may also include an applicator coupled to the solid state microwave amplification module, where the applicator is a dielectric resonator.

14 Claims, 9 Drawing Sheets

Related U.S. Application Data continuation of application No. 15/238,695, filed on Aug. 16, 2016, now Pat. No. 10,748,745.

(52) U.S. Cl.
CPC ... *H01J 37/32201* (2013.01); *H01J 37/32211* (2013.01); *H01J 37/32247* (2013.01); *H01J 37/32311* (2013.01); *H01J 37/3244* (2013.01); *H01J 2237/334* (2013.01)

(56)           References Cited

U.S. PATENT DOCUMENTS

| | | | |
|---|---|---|---|
| 5,180,436 | A | 1/1993 | Ueda et al. |
| 5,296,036 | A * | 3/1994 | Matsuyama .......... H01L 31/202 |
| | | | 136/258 |
| 5,961,871 | A | 10/1999 | Bible et al. |
| 6,109,208 | A | 8/2000 | Tsuchihashi et al. |
| 6,158,383 | A | 12/2000 | Watanabe et al. |
| 6,204,603 | B1 | 3/2001 | Spitzl et al. |
| 6,263,830 | B1 | 7/2001 | Kamarehi et al. |
| 6,358,361 | B1 | 3/2002 | Matsumoto |
| 6,741,944 | B1 | 5/2004 | Verdeyen et al. |
| 8,308,898 | B2 | 11/2012 | Kasai et al. |
| 9,245,741 | B2 | 1/2016 | Karakawa |
| 9,281,154 | B2 | 3/2016 | Ikeda et al. |
| 9,478,410 | B2 | 10/2016 | Kamada et al. |
| 2003/0201162 | A1 * | 10/2003 | Liu .................... H01J 37/32082 |
| | | | 204/298.03 |
| 2004/0007983 | A1 | 1/2004 | Sirkis et al. |
| 2004/0011465 | A1 | 1/2004 | Matsumoto et al. |
| 2005/0173069 | A1 | 8/2005 | Tolmachev et al. |
| 2006/0057854 | A1 | 3/2006 | Setsuhara et al. |
| 2006/0081624 | A1 | 4/2006 | Takada et al. |
| 2006/0137613 | A1 | 6/2006 | Kasai |
| 2007/0007244 | A1 * | 1/2007 | Hichri .................... G01M 3/226 |
| | | | 156/345.24 |
| 2008/0182416 | A1 * | 7/2008 | Collins ............. H01J 37/32165 |
| | | | 438/714 |
| 2009/0159214 | A1 | 6/2009 | Kasai |
| 2009/0194508 | A1 | 8/2009 | Ul et al. |
| 2010/0074807 | A1 | 3/2010 | Bulkin et al. |
| 2010/0194195 | A1 * | 8/2010 | Coumou .......... H01J 37/32174 |
| | | | 307/24 |
| 2011/0061814 | A1 | 3/2011 | Ikeda |
| 2011/0174778 | A1 | 7/2011 | Sawada et al. |
| 2011/0195201 | A1 | 8/2011 | Zhu et al. |
| 2013/0284370 | A1 | 10/2013 | Collins et al. |
| 2014/0002196 | A1 | 1/2014 | Leek |
| 2014/0197761 | A1 | 7/2014 | Grandemenge et al. |
| 2014/0283780 | A1 | 9/2014 | Smith et al. |
| 2015/0007774 | A1 | 1/2015 | Iwasaki et al. |
| 2015/0007940 | A1 | 1/2015 | Kaneko et al. |
| 2015/0144265 | A1 | 5/2015 | Fujino et al. |
| 2015/0206778 | A1 | 7/2015 | Shimomura |
| 2015/0211124 | A1 | 7/2015 | Nozawa et al. |
| 2015/0212127 | A1 | 7/2015 | Ikeda et al. |
| 2015/0232993 | A1 | 8/2015 | Iwao et al. |
| 2015/0255258 | A1 | 9/2015 | Nozawa et al. |
| 2015/0279627 | A1 | 10/2015 | Iwasaki et al. |
| 2015/0371828 | A1 | 12/2015 | Stowell |
| 2016/0189950 | A1 | 6/2016 | Oyama et al. |
| 2016/0322218 | A1 | 11/2016 | Fukiage et al. |
| 2017/0133202 | A1 | 5/2017 | Berry, III |
| 2018/0127880 | A1 | 5/2018 | Kotani et al. |
| 2018/0218883 | A1 | 8/2018 | Iwao |
| 2018/0277339 | A1 | 9/2018 | Kaneko et al. |
| 2020/0381217 | A1 | 12/2020 | Kraus et al. |

FOREIGN PATENT DOCUMENTS

| | | |
|---|---|---|
| CN | 103258706 A | 8/2013 |
| CN | 103543349 A | 1/2014 |
| EP | 0449081 * | 10/1991 ........ H01J 37/32192 |
| EP | 0459177 A2 | 12/1991 |
| ES | 2589109 * | 11/2016 ........ H01J 37/32192 |
| JP | 2006/156100 | 6/2006 |
| JP | WO2008013112 A1 | 12/2009 |
| JP | 2010-087227 A | 4/2010 |
| JP | 2010087227 | 4/2010 |
| JP | 2010-157511 A | 7/2010 |
| JP | 2010157511 | 7/2010 |
| JP | 2011/014542 | 1/2011 |
| JP | 2013/171847 | 9/2013 |
| KR | 1020110018431 A | 2/2011 |
| TW | 480414 | 3/2002 |
| TW | 2013/06080 | 2/2013 |
| TW | 2015/01573 | 1/2015 |
| TW | 201626429 A | 7/2016 |
| WO | WO 9912184 * | 3/1999 ........ H01J 37/32192 |
| WO | WO 2013/114870 | 8/2013 |
| WO | WO 2013/122043 | 8/2013 |
| WO | WO 2014/017132 | 1/2014 |
| WO | WO 2014/184544 | 11/2014 |
| WO | WO 2016/089424 | 6/2016 |

OTHER PUBLICATIONS

Official Letter from Taiwan Patent Application No. 111149118 dated Oct. 5, 2023, 10 pgs.
Non-Final Office Action from U.S. Appl. No. 15/238,695 dated Jan. 25, 2019, 30 pgs.
Non-Final Office Action from U.S. Appl. No. 15/485,217 mailed May 15, 2019, 23 pgs.
Non-Final Office Action from U.S. Appl. No. 15/238,695 dated Jul. 5, 2019, 25 pgs.
Final Office Action from U.S. Appl. No. 15/238,695 dated Dec. 4, 2019, 26 pgs.
Official Letter from Taiwan Patent Application No. 106102799 dated Jul. 28, 2020, 13 pgs.
Notice of First Office Action from Chinese Patent Application No. 201780047022.5 dated Nov. 2, 2020, 15 pgs.
Notice of Reasons for Rejection from Japanese Patent Application No. 2019-508867 dated Dec. 28, 2020, 6 pgs.
Notice of Reasons for Rejection from Japanese Patent Application No. 2019-508867 dated Aug. 10, 2021, 6 pgs.
Non-Final Office Action from U.S. Appl. No. 16/994,136 dated Dec. 2, 2021, 35 pgs.
Official Letter from Taiwan Patent Application No. 110103753 dated Jan. 20, 2022, 9 pgs.
First Office Action from Chinese Patent Application No. 202110873080.1 dated Aug. 25, 2023, 18 pgs.
Notice of Reasons for Rejection from Japanese Patent Application No. 2022-043272 dated Jan. 27, 2023, 9 pgs.
Office Action from Japanese Patent Application No. 2023-135363, mailed May 7, 2023, 11 pgs.
Preliminary rejection from Korean Patent Application No. 10-2019-7007687 dated Apr. 8, 2024, 5 pgs.
International Search Report and Written Opinion from PCT/US2017/013984 dated May 1, 2017, 10 pgs.
International Search Report and Written Opinion from PCT/US2018/022044 mailed Jun. 29, 2018, 11 pgs.
International Search Report and Written Opinion from PCT/US2018/026330 mailed Jul. 26, 2018, 12 pgs.
International Preliminary Report on Patentability from PCT/US2017/013984 mailed Feb. 19, 2019, 8 pgs.
International Preliminary Report on Patentability from PCT/US2018/022044 dated Oct. 24, 2019, 8 pgs.
International Preliminary Report on Patentability from PCT/US2018/026330 dated Nov. 21, 2019, 9 pgs.
Preliminary Rejection for Korean Patent Application No. 10-2019-700687, dated Nov. 19, 2024, 6 pages.
Notice to File a Response from Korean Patent Application No. 10-2025-7030733 dated Apr. 17, 2026, 5 pgs.

* cited by examiner

MODULAR MICROWAVE PLASMA SOURCE

CROSS-REFERENCE TO RELATED APPLICATIONS

This application is a continuation of U.S. patent application Ser. No. 16/994,136, filed on Aug. 14, 2020, which is a continuation of U.S. patent application Ser. No. 15/238,695, filed on Aug. 16, 2016, now U.S. Pat. No. 10,748,745, issued on Aug. 18, 2020, the entire contents of which are hereby incorporated by reference herein.

BACKGROUND

1) Field

Embodiments relate to the field of microwave plasma sources and, in particular, to a modular microwave plasma source that includes solid state electronics and an applicator for coupling the microwave radiation to a gas to form a plasma.

2) Description of Related Art

Plasma processing is used extensively in the manufacture of many different technologies, such as those in the semiconductor industry, display technologies, microelectromechanical systems (MEMS), and the like. Currently, radio frequency (RF) generated plasmas are most often used. However, plasmas generated with a microwave source allow for denser plasmas and/or plasmas with a high concentration of excited neutral species. Unfortunately, plasmas generated with a microwave source also suffer their own drawbacks.

Typical microwave plasma systems use a singular, large source of microwave radiation (typically a magnetron) and a transmission path for guiding the microwave radiation from the magnetron to the processing chamber. For typical high power applications in the semiconductor industry, the transmission path is a microwave waveguide. Waveguides are used because outside of a waveguide designed to carry the specific frequency of the microwave source, the microwave power attenuates rapidly with distance. Additional components, such as tuners, couplers, mode transformers, and the like are also required to transmit the microwave radiation to the processing chamber. These components limit the construction to large systems (i.e., at least as large as the sum of the waveguide and associated components), and severely limit the design. As such the geometry of the plasma that may be produced is constrained since the geometry of the plasma resembles the shape of the waveguides. Accordingly, it is difficult to match the geometry of the plasma to the geometry of the substrate that is being processed. In particular, it is difficult to create a microwave plasma where the plasma is generated over the entire surface of the wafer of larger substrates (e.g., 300 mm or greater wafers). Some microwave generated plasmas may use a slot line antenna to allow the microwave energy to be spread over an extended surface. However, such systems are complicated, require specific geometry, and are limited in the power density that can be coupled to the plasma.

Furthermore, microwave sources typically generate plasmas that are not highly uniform and/or are not able to have a spatially tunable density. As the substrates that are being processed continue to increase in size, it becomes increasingly difficult to account for edge effects. Additionally, the inability to tune the plasma limits the ability to modify processing recipes to account for incoming substrate nonuniformity and adjust the plasma density for processing systems in which a nonuniformity is required to compensate for the design of the processing system (e.g., to accommodate the nonuniform radial velocity of the rotating wafers in some processing chambers).

SUMMARY

Embodiments include a modular microwave source. In an embodiment, the modular microwave source comprises a voltage control circuit, a voltage controlled oscillator, where an output voltage from the voltage control circuit drives oscillation in the voltage controlled oscillator. The modular microwave source may also include a solid state microwave amplification module coupled to the voltage controlled oscillator. In an embodiment, the solid state microwave amplification module amplifies an output from the voltage controlled oscillator. The modular microwave source may also include an applicator coupled to the solid state microwave amplification module, where the applicator is a dielectric resonator.

Additional embodiments may include a plasma processing tool that comprises a processing chamber and a plurality of modular microwave sources that are coupled to the processing chamber. The plurality of modular microwave sources may include an array of applicators, where the array of applicators are positioned opposing a chuck in the processing chamber on which one or more substrates are processed and an array of microwave amplification modules, where each microwave amplification module is coupled to a different one of the applicators in the array of applicators.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
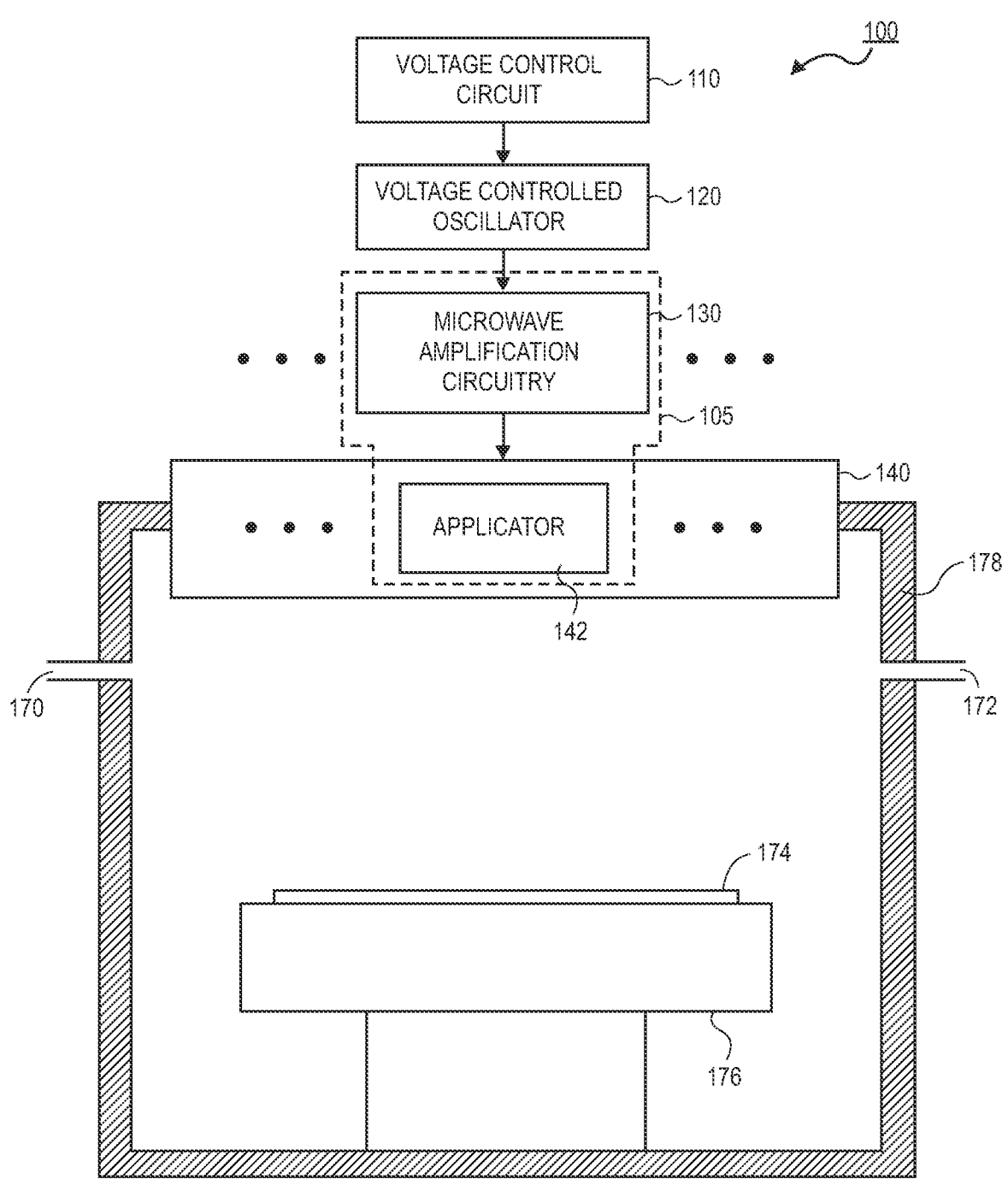
FIG. 1 is a schematic diagram of a plasma processing tool that includes a modular microwave plasma source, in accordance with an embodiment.

Devices that include one or more modular microwave plasma sources are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a microwave source that comprises one or more microwave modules. According to an embodiment, each microwave module comprises a microwave solid state electronics portion and an applicator portion. In an embodiment, the applicator portion may be a dielectric resonator.

The use of solid state electronics instead of a magnetron allows for a significant reduction in the size and the complexity of the plasma source. Particularly, the solid state components are much smaller than the magnetron hardware described above. Additionally, the use of solid state components allows for the elimination of bulky waveguides needed to transmit the microwave radiation to the processing chamber. Instead, the microwave radiation may be transmitted with coaxial cabling. The elimination of waveguides also allows for the construction of a large area microwave source where the size of the plasma formed is not limited by the size of waveguides. Instead, an array of microwave modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array).

The use of an array of microwave modules also provides greater flexibility in the ability to locally change the plasma density by independently changing the power settings of each microwave module. This allows for uniformity optimization during plasma processing, such as adjustments made for wafer edge effects, adjustments made for incoming wafer nonuniformity, and the ability to adjust the plasma density for processing systems in which a nonuniformity is needed to compensate for the design of the processing system (e.g., to accommodate the nonuniform radial velocity of the rotating wafers in some processing chambers).

Additional embodiments may also include one or more plasma monitoring sensors. Such embodiments provide a way to measure the density of the plasma (or any other plasma property) locally by each applicator, and to use that measurement as part of a feedback loop to control the power applied to each microwave module. Accordingly, each microwave module may have independent feedback, or a subset of the microwave modules in the array may be grouped in zones of control where the feedback loop controls the subset of microwave modules in the zone.

In addition to the enhanced tuneability of the plasma, the use of individual microwave modules provides a greater power density than currently available plasma sources. For example, microwave modules may allow for a power density that is approximately five or more times greater than typical RF plasma processing systems. For example, typical power into a plasma enhanced chemical vapor deposition process is approximately 3,000 W, and provides a power density of approximately 4 W/cm² for a 300 mm diameter wafer. In contrast, microwave modules according to embodiments may use a 300 W power amplifier with a 4 cm diameter applicator, to provide a power density of approximately 24 W/cm².

Referring now to FIG. 1, a cross-sectional illustration of a processing tool 100 is shown, according to an embodiment. The processing tool 100 may be a processing tool suitable for any type of processing operation that utilizes a plasma. For example, the plasma processing tool 100 may be a processing tool used for plasma enhanced chemical vapor deposition (PECVD), plasma enhanced atomic layer deposition (PEALD), etch and selective removal, and plasma cleaning. While the embodiments described in detail herein are directed to plasma processing tools, it is to be appreciated that additional embodiments may include a processing tool 100 that include any tool that utilizes microwave radiation. For example, a processing tool 100 that utilizes microwave radiation without needing the formation of a plasma may include industrial heating and/or curing processing tools 100.

Generally, embodiments include a processing tool 100 that includes a chamber 178. In processing tools 178 that are used for plasma processing, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool may include a showerhead for evenly distributing the processing gases over a substrate 174.

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing. Due to the modular configuration of the microwave modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes one or more modular microwave sources 105. The modular microwave source 105 may include solid state microwave amplification circuitry 130 and an applicator 142. In an embodiment, a voltage control circuit 110 provides an input voltage to a voltage controlled oscillator 120 in order to produce microwave radiation at a desired frequency that is transmitted to the solid state microwave amplification circuitry 130 in each modular microwave source 105. After processing by the microwave amplification circuitry 130, the microwave radiation is transmitted to the applicator 142. According to an embodiment, an array 140 of applicators 142 are coupled to the chamber 178 and each function as an antenna for coupling the microwave radiation to the processing gasses in the chamber 178 to produce a plasma.

Figure 2:
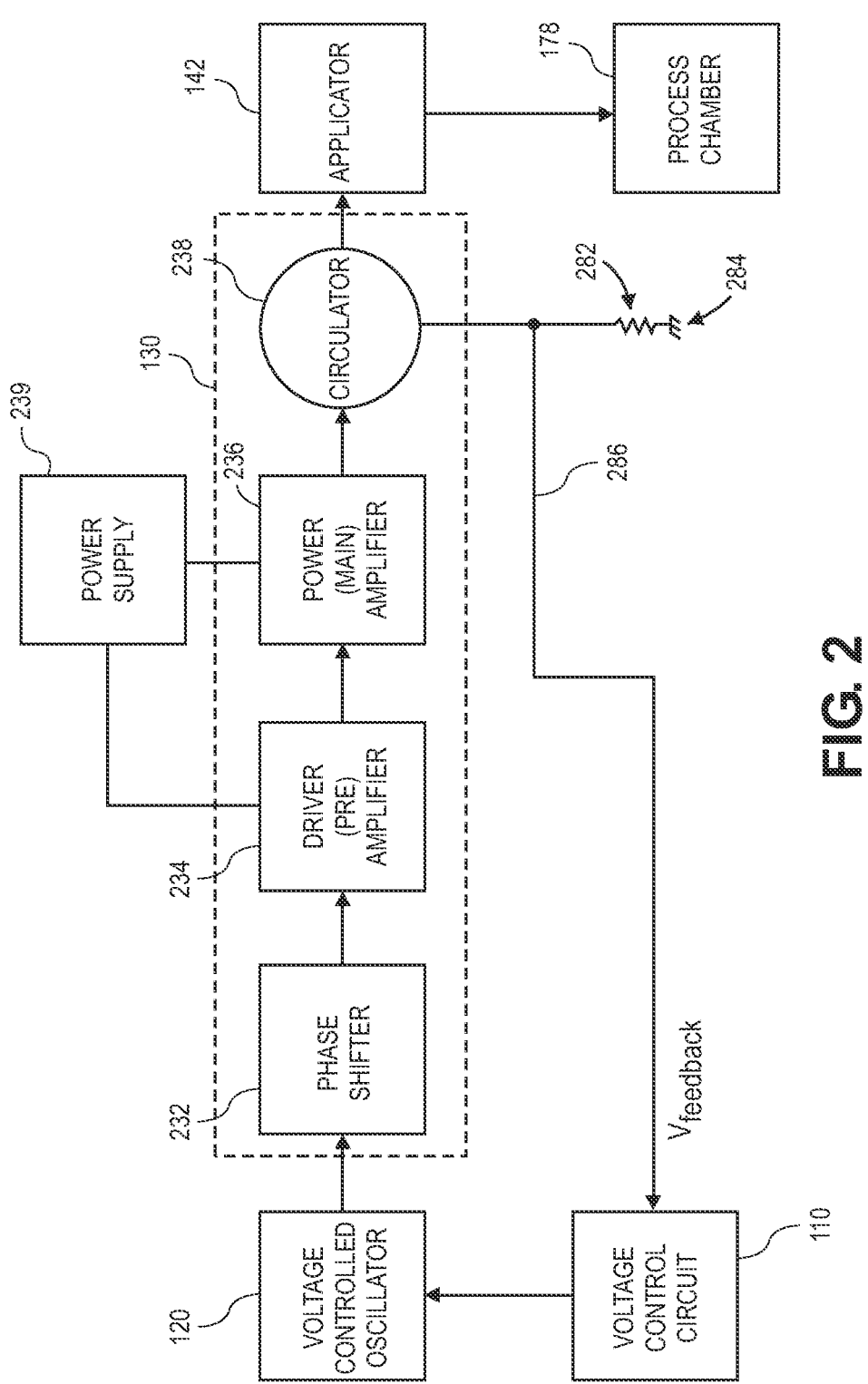
FIG. 2 is a schematic block diagram of a solid state microwave plasma source, in accordance with an embodiment.

Referring now to FIG. 2, a schematic block diagram of the electronics in a modular microwave source is shown and described in greater detail, according to an embodiment. As described above, a voltage control circuit 110 provides an input voltage to a voltage controlled oscillator 120. Embodiments may include an input voltage between approximately 1V and 10V DC. The voltage controlled oscillator 120 is an electronic oscillator whose oscillation frequency is controlled by the input voltage. According to an embodiment, the input voltage from the voltage control circuit 110 results in the voltage controlled oscillator 120 oscillating at a desired frequency. In an embodiment, the microwave radiation may have a frequency between approximately 2.3 GHz and 2.6 GHz.

According to an embodiment, the microwave radiation is transmitted from the voltage controlled oscillator 120 to the microwave amplification circuitry 130. In the illustrated embodiment, a single instance of the microwave amplification circuitry 130 is shown. However, embodiments may include any number of instances of microwave amplification circuitry 130. Particularly, the number of instances of microwave amplification circuitry 130 may be equal to the number of applicators 142 needed in the array 140 of applicators 142. As such, each applicator 142 may be coupled to different instances of the microwave amplification circuitry 130 to provide individual control of the power supplied to each applicator 142. According to an embodiment, when more than one modular microwave source 105 is used in the process tool 100, the microwave amplification circuitry 130 may include a phase shifter 232. When only a single applicator is used, the phase shifter 232 may be omitted. The microwave amplification circuitry 130 may also include a driver/pre-amplifier 234, and a main microwave power amplifier 236 that are each coupled to a power supply 239. According to an embodiment, the microwave amplification circuitry 130 may operate in a pulse mode. For example, the microwave amplification circuitry 130 may have a duty cycle between 1% and 99%. In a more particular embodiment, the microwave amplification circuitry 130 may have a duty cycle between approximately 15% and 30%.

In an embodiment, the microwave radiation may be transmitted to the applicator 142 after being amplified. However, part of the power transmitted to the applicator 142 may be reflected back due to the mismatch in the output impedance. Accordingly, some embodiments also include a feedback line 286 that allows for the level of reflected power to be fed back to the voltage control circuit 110. The level of reflected power V$_{feedback}$ may be directed to the feedback line 286 by using a circulator 238 between the power amplifier 236 and the applicator 142. The circulator 238 directs the reflected power to a dummy load 282 and ground 284, with the level of reflected power V$_{feedback}$ being read prior to the dummy load 282. In an embodiment, the level of reflected power V$_{feedback}$ may be used by the voltage control circuit 110 to adjust the output voltage that is sent to the voltage controlled oscillator 120, which in turn varies the output frequency of the microwave radiation that is transmitted to the microwave amplification circuitry 130. The presence of such a feedback loop allows for embodiments to provide continuous control of the input voltage of the voltage controlled oscillator 120, and allows for reductions in the level of reflected power V$_{feedback}$. In an embodiment, the feedback control of the voltage controlled oscillator 120 may allow for the level of the reflected power to be less than approximately 5% of the forward power. In some embodiments, the feedback control of the voltage controlled oscillator 120 may allow for the level of the reflected power to be less than approximately 2% of the forward power. Accordingly, embodiments allow for an increased percentage of the forward power to be coupled into the processing chamber 178, and increases the available power density coupled to the plasma. Furthermore, impedance tuning using a feedback line 286 is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 120.

Figure 3A:
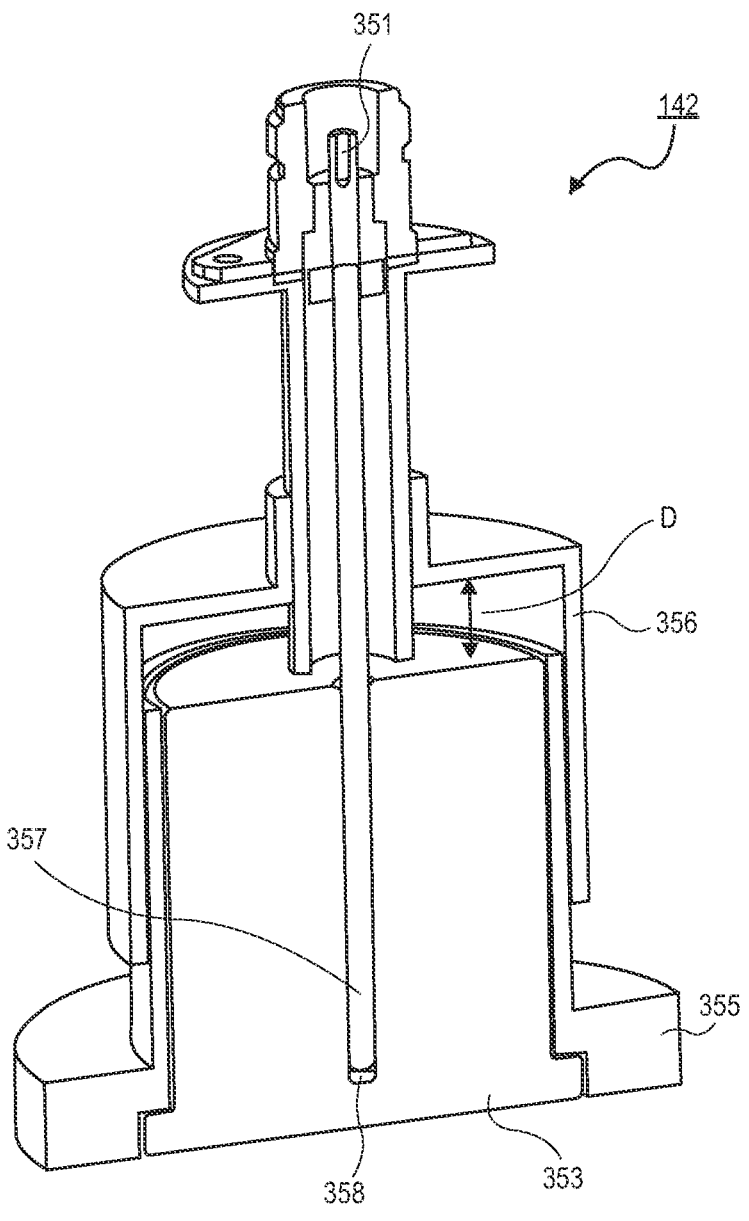
FIG. 3A is cross-sectional illustration of an applicator that may be used to couple microwave radiation to a processing chamber, in accordance with an embodiment.

Referring now to FIG. 3A, a cut-away illustration of an applicator 142 is shown, according to an embodiment. In an embodiment, the microwave radiation is transmitted to an applicator 142 by a coaxial cable 351 that couples to a monopole 357 that extends axially through the applicator 142. The monopole 357 may also extend into a channel 358 formed into a center of a dielectric resonant cavity 353. The dielectric resonant cavity 353 may be a dielectric material, such as quartz, aluminum oxide, titanium oxide, or the like. Additional embodiments may also include a resonant cavity 353 that does not include a material (i.e., the dielectric resonant cavity 353 may be air or a vacuum). According to an embodiment, the dielectric resonator is dimensioned so that the dielectric resonator supports resonance of the microwave radiation. Generally, the size of the dielectric resonant cavity 353 is dependent on the dielectric constant of the material used to form the dielectric resonant cavity 353 and the frequency of the microwave radiation. For example, materials with higher dielectric constants would allow for smaller resonant cavities 353 to be formed. In an embodiment where the dielectric resonant cavity 353 includes a circular cross-section, the diameter of the dielectric resonant cavity 353 may be between approximately 1 cm and 15 cm. In an embodiment, the cross-section of the dielectric resonant cavity 353 along a plane perpendicular to the monopole 357 may be any shape, so long as the dielectric resonant cavity 353 is dimensioned to support resonance. In the illustrated embodiment, the cross-section along a plane perpendicular to the monopole 357 is circular, though other shapes may also be used, such as polygons (e.g., triangles, rectangles, etc.), symmetrical polygons (e.g., squares, pentagons, hexagons, etc.), ellipses, or the like).

In an embodiment, the cross-section of the dielectric resonant cavity 353 may not be the same at all planes perpendicular to the monopole 357. For example, the cross-section of a bottom extension proximate to the open end of the applicator housing 355 is wider than the cross-section of the dielectric resonant cavity proximate to the channel 358. In addition to having cross-sections of different dimensions, the dielectric resonant cavity 353 may have cross-sections with different shapes. For example, the portion of the dielectric resonant cavity 353 proximate to the channel 358 may have a circular shaped cross-section, whereas the portion of the dielectric resonant cavity 353 proximate to the open end of the applicator housing 355 may be a symmetrical polygon shape (e.g., pentagon, hexagon, etc.). However, it is to be appreciated that embodiments may also include a dielectric resonant cavity 353 that has a uniform cross-section at all planes perpendicular to the monopole 357.

According to an embodiment, the applicator 353 may also include an impedance tuning backshort 356. The backshort

356 may be a displaceable enclosure that slides over an outer surface of the applicator housing 355. When adjustments to the impedance need to be made, an actuator (not shown) may slide the backshort 356 along the outer surface of the applicator housing 355 to change a distance D between a surface of the backshort 356 and a top surface of the dielectric resonant cavity 353. As such, embodiments provide more than one way to adjust the impedance in the system. According to an embodiment, an impedance tuning backshort 356 may be used in conjunction with the feedback process described above to account for impedance mismatches. Alternatively, the feedback process or an impedance tuning backshort 356 may be used by themselves to adjust for impedance mismatches.

According to an embodiment, the applicator 142 functions as a dielectric antenna that directly couples the microwave electromagnetic field into the processing chamber 178. The particular axial arrangement of the monopole 357 entering the dielectric resonant cavity 353 may produce an TM01δ mode excitation. However different modes of excitation may be possible with different applicator arrangements. For example, while an axial arrangement is illustrated in FIG. 3, it is to be appreciated that the monopole 357 may enter the dielectric resonant cavity 353 from other orientations. In one such embodiment, the monopole 357 may enter the dielectric resonant cavity 353 laterally, (i.e., through a sidewall of the dielectric resonant cavity 353).

Figure 3B:
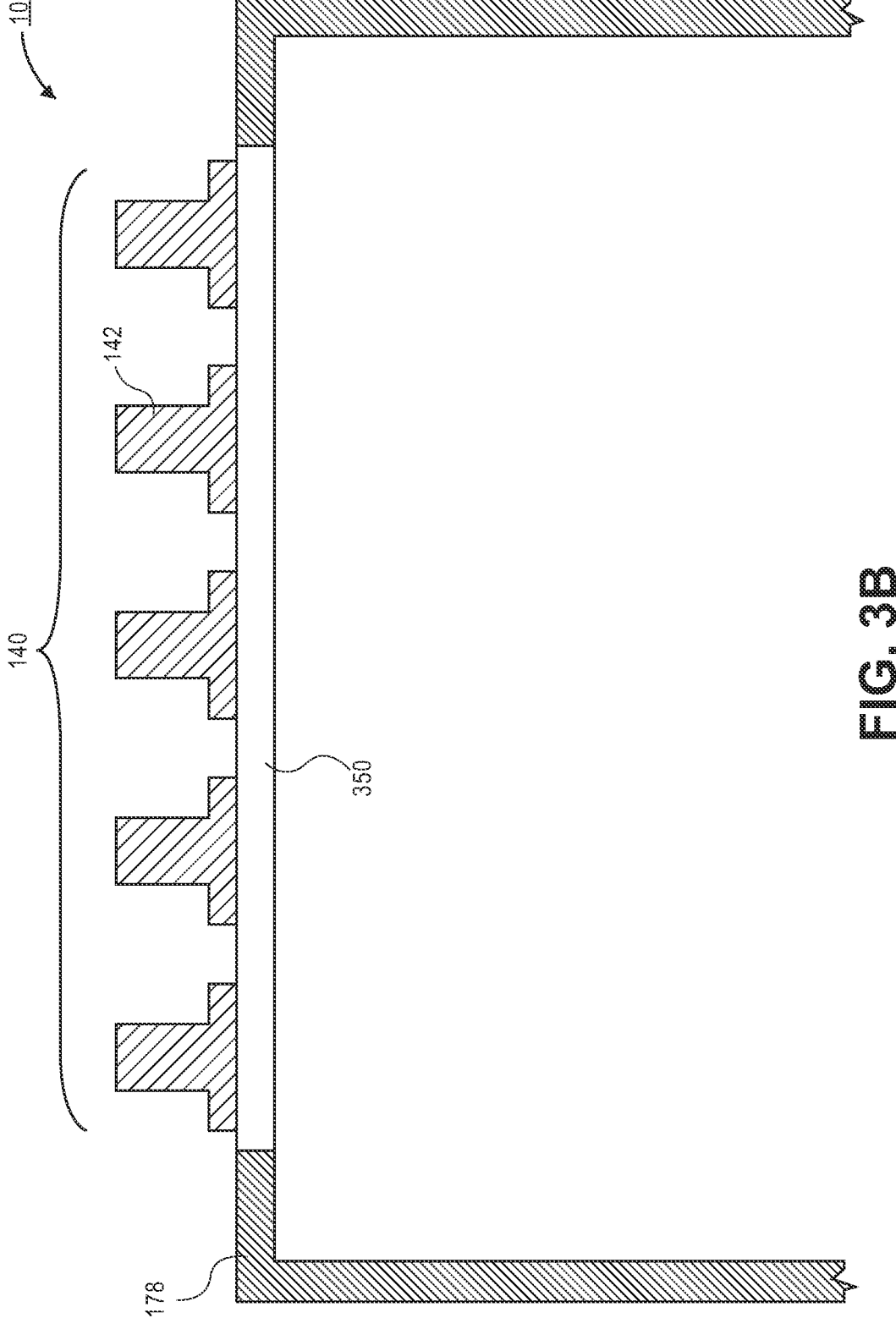
FIG. 3B is a cross-sectional illustration of an array of applicators positioned on a dielectric sheet that is part of the processing chamber, in accordance with an embodiment.

Referring now to FIG. 3B, an illustration of a portion of a processing tool 100 with an array 140 of applicators 142 coupled to the chamber 178 is shown, according to an embodiment. In the illustrated embodiment, the microwave radiation from the applicators 142 is coupled into the chamber 178 by being positioned proximate to a dielectric plate 350. The proximity of the applicators 142 to the dielectric plate 350 allows for the microwave radiation resonating in the dielectric resonant cavity 353 (not shown in FIG. 3B) to couple with the dielectric plate 350, which may then couple with processing gasses in the chamber to generate a plasma. In one embodiment, the dielectric resonant cavity 353 may be in direct contact with the dielectric plate 350. In an additional embodiment, the dielectric resonant cavity 353 may be spaced away from a surface of the dielectric plate 350, so long as the microwave radiation can still be transferred to the dielectric plate 350.

According to an embodiment, the array 140 of applicators 142 may be removable from the dielectric plate 350 (e.g., for maintenance, to rearrange the array of applicators to accommodate a substrate with different dimensions, or for any other reason) without needing to remove the dielectric plate 350 from the chamber 178. Accordingly, the applicators 142 may be removed from the processing tool 100 without needing to release a vacuum in the chamber 178. According to an additional embodiment, the dielectric plate 350 may also function as a gas injection plate or a showerhead.

Figure 4A:
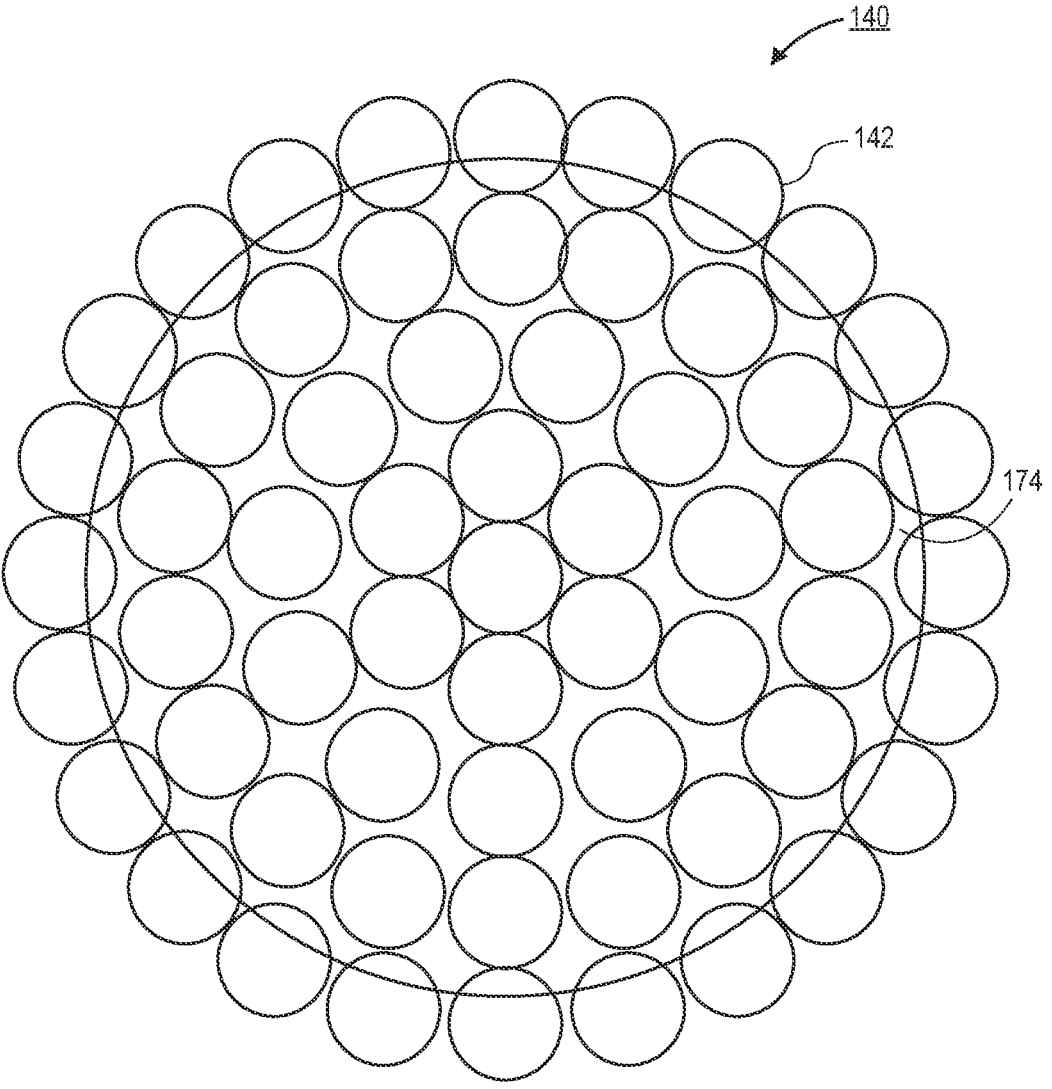
FIG. 4A is a plan view of an array of applicators that may be used to couple microwave radiation to a processing chamber, in accordance with an embodiment.

As noted above, an array of applicators 140 may be arranged so that they provide coverage of an arbitrarily shaped substrate 174. FIG. 4A is a plan view illustration of an array 140 of applicators 142 that are arranged in a pattern that matches a circular substrate 174. By forming a plurality of applicators 142 in a pattern that roughly matches the shape of the substrate 174, the plasma becomes tunable over the entire surface of the substrate 174. For example, each of the applicators 142 may be controlled so that a plasma with a uniform plasma density across the entire surface of the substrate 174 is formed. Alternatively, one or more of the applicators 142 may be independently controlled to provide plasma densities that are variable across the surface of the substrate 174. As such, incoming nonuniformity present on the substrate may be corrected. For example, the applicators 142 proximate to an outer perimeter of the substrate 174 may be controlled to have a different power density than applicators proximate to the center of the substrate 174.

In FIG. 4A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 4B:
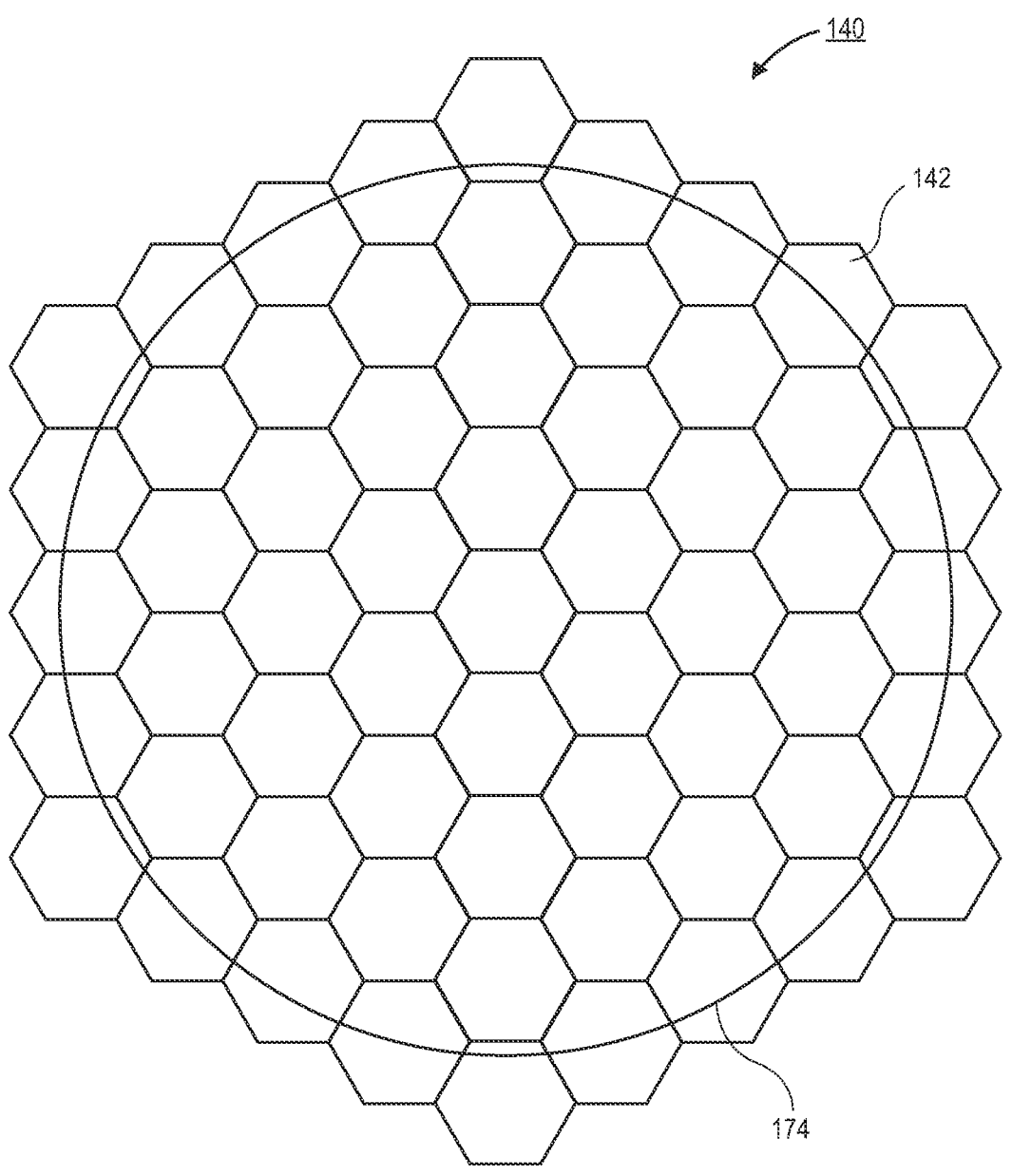
FIG. 4B is a plan view of an array of applicators that may be used to couple microwave radiation to a processing chamber, in accordance with an additional embodiment.

Referring now to FIG. 4B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 4B illustrates neighboring applicators 142 sharing sidewall surfaces, it is to be appreciated that embodiments may also include non-circular symmetrically shaped applicators that include spacing between neighboring applicators 142.

Figure 4C:
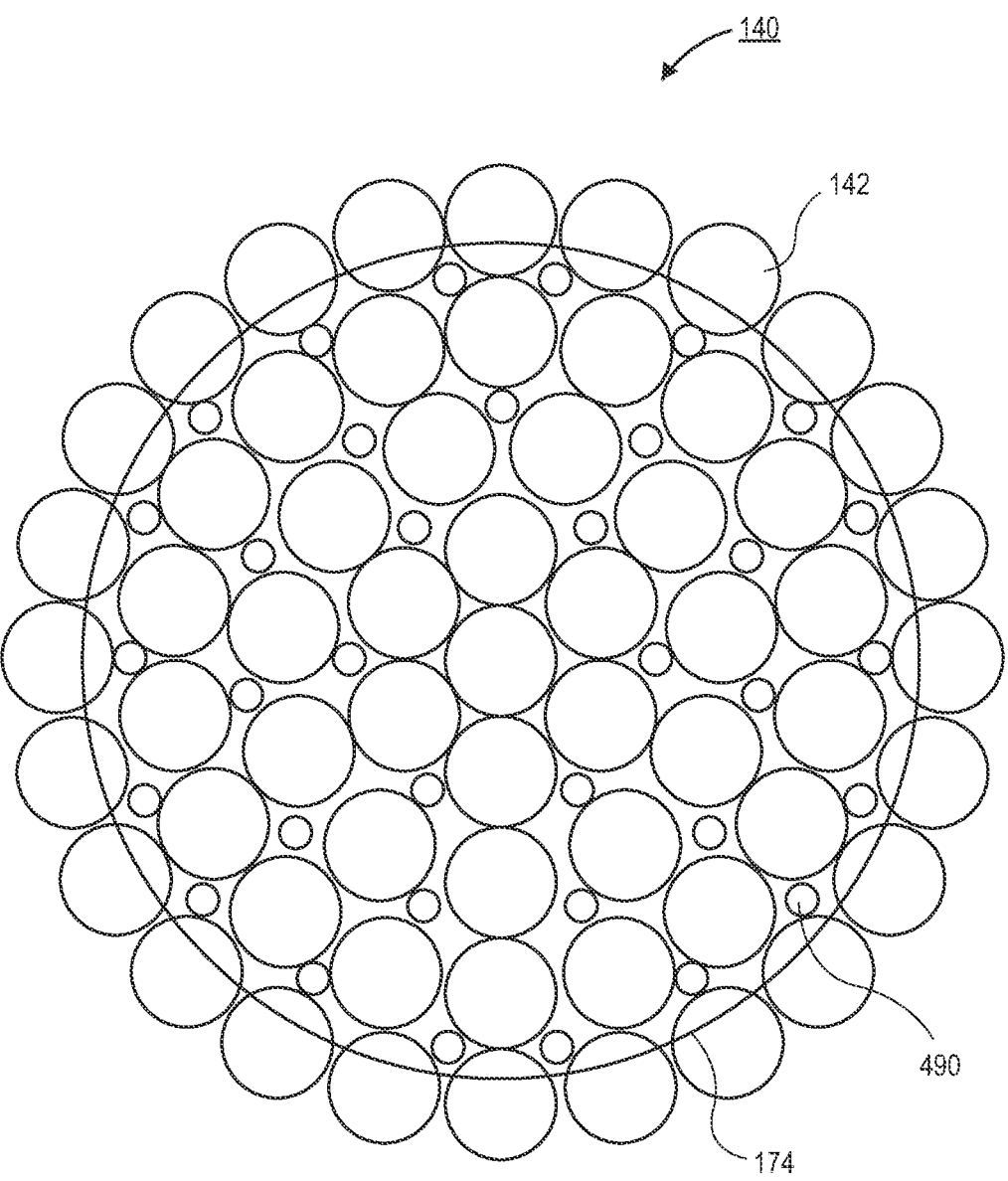
FIG. 4C is a plan view of an array of applicators and a plurality of sensors for detecting conditions of a plasma, in accordance with an embodiment.

Referring now to FIG. 4C, an additional plan-view illustration of an array 140 of applicators 142 is shown according to an embodiment. The array 140 in FIG. 4C is substantially similar to the array 140 described above with respect to FIG. 4A, except that a plurality of sensors 490 are also included. The plurality of sensors provides improved process monitoring capabilities that may be used to provide additional feedback control of each of the modular microwave sources 105. In an embodiment, the sensors 490 may include one or more different sensor types 490, such as plasma density sensors, plasma emission sensors, or the like. Positioning the sensors across the surface of the substrate 174 allows for the plasma properties at given locations of the processing chamber 100 to be monitored.

According to an embodiment, every applicator 142 may be paired with a different sensor 490. In such embodiments, the output from each sensor 490 may be used to provide feedback control for the respective applicator 142 to which the sensor 490 has been paired. Additional embodiments may include pairing each sensor 490 with a plurality of applicators 142. For example, each sensor 490 may provide feedback control for multiple applicators 142 to which the sensor 490 is proximately located. In yet another embodiment, feedback from the plurality of sensors 490 may be used as a part of a multi-input multi-output (MIMO) control system. In such an embodiment, each applicator 142 may be adjusted based on feedback from multiple sensors 490. For example, a first sensor 490 that is a direct neighbor to a first applicator 142 may be weighted to provide a control effort to the first applicator 142 that is greater than the control effort exerted on the first applicator 142 by a second sensor 490 that is located further from the first applicator 142 than the first sensor 490.

Figure 4D:
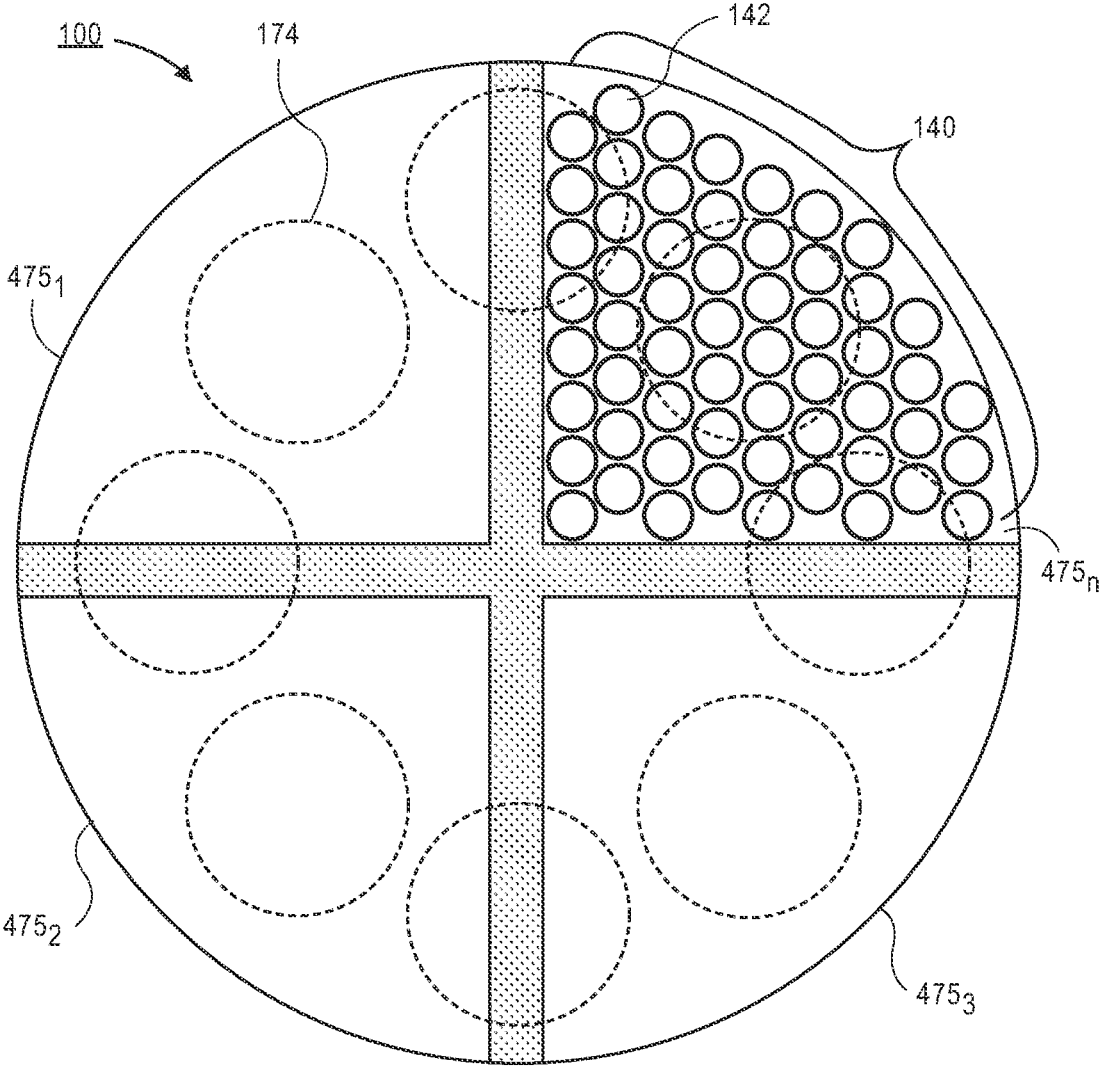
FIG. 4D is a plan view of an array of applicators that are formed in one zone of a multi-zone processing tool, in accordance with an embodiment.

Referring now to FIG. 4D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones $475_1$-$475_n$. Each zone 475 may be configured to perform different processing operations on substrates 174 that are rotated through the different zones 475. As illustrated, a single array 140 is positioned in zone $475_n$. However, embodiments may include multi-zone processing tools 100 with an array 140 of applicators 142 in one or more of the different zones 475, depending on the needs of the device. The spatially tunable density of the plasma provided by embodiments allows for the accommodation of nonuniform radial velocity of the rotating substrates 174 as they pass through the different zones 475.

Figure 5:
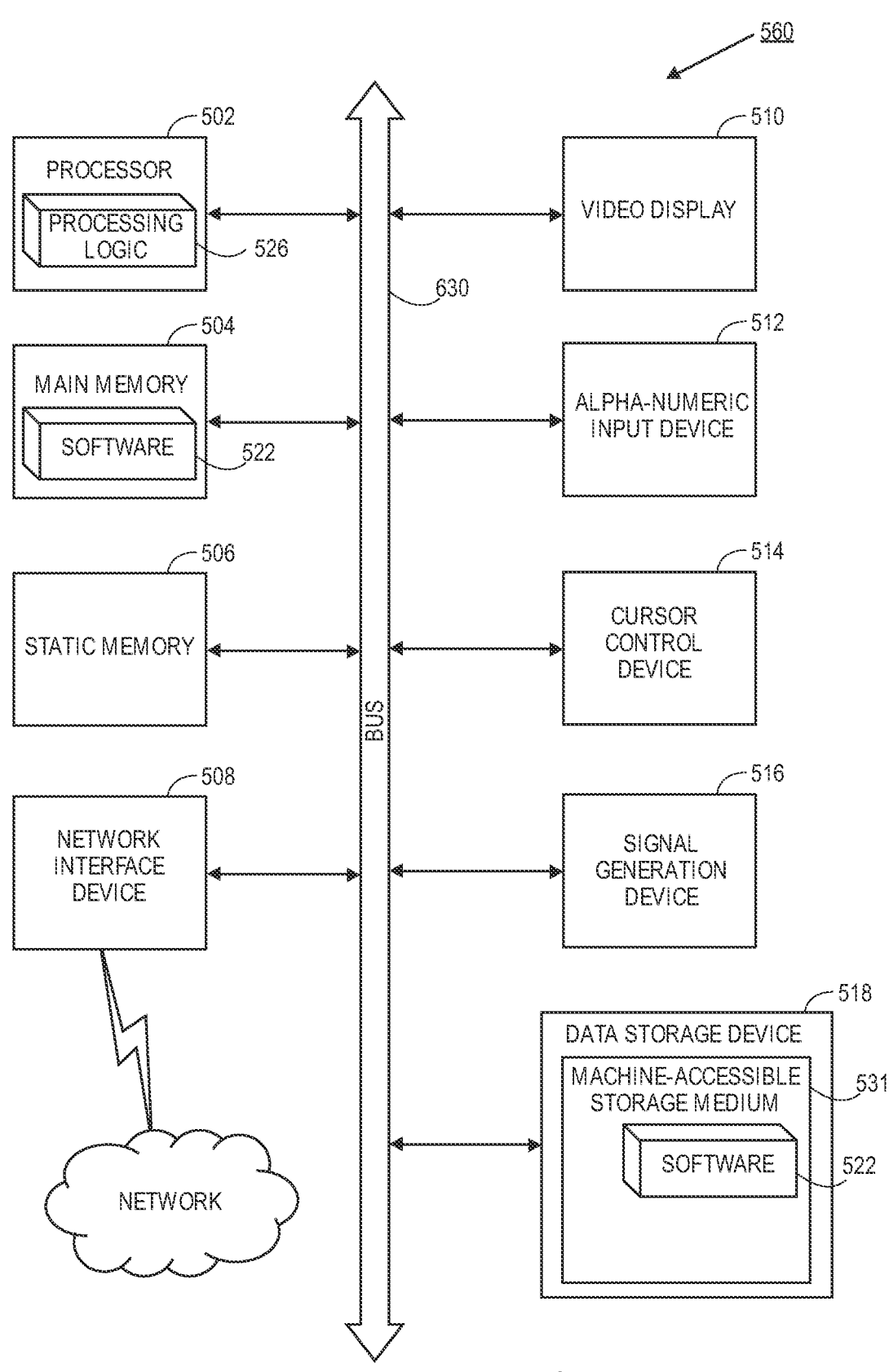
FIG. 5 illustrates a block diagram of an exemplary computer system that may be used in conjunction with a modular microwave radiation source, in accordance with an embodiment.

Referring now to FIG. 5, a block diagram of an exemplary computer system 560 of a processing tool 100 is illustrated in accordance with an embodiment. In an embodiment, computer system 560 is coupled to and controls processing in the processing tool 100. Computer system 560 may be connected (e.g., networked) to other machines in a Local Area Network (LAN), an intranet, an extranet, or the Internet. Computer system 560 may operate in the capacity of a server or a client machine in a client-server network environment, or as a peer machine in a peer-to-peer (or distributed) network environment. Computer system 560 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 560, the term "machine" shall also be taken to include any collection of machines (e.g., computers) that individually or jointly execute a set (or multiple sets) of instructions to perform any one or more of the methodologies described herein.

Computer system 560 may include a computer program product, or software 522, having a non-transitory machine-readable medium having stored thereon instructions, which may be used to program computer system 560 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 560 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets.

System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 560 may further include a system network interface device 508 for communicating with other devices or machines. The computer system 560 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 818 may include a machine-accessible storage medium 531 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 560, the main memory 504 and the system processor 502 also constituting machine-readable storage media. The software 522 may further be transmitted or received over a network 520 via the system network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A plasma processing tool, comprising:
   a processing chamber;
   a dielectric lid for sealing the chamber;
   an array of applicators arranged across an outer surface of the dielectric chamber lid, wherein each applicator is coupled to a different microwave amplification module; and
   a plurality of sensors within the chamber and attached to the dielectric lid, wherein the sensors are communicatively coupled to the microwave amplification modules to provide feedback control for the plasma processing tool, wherein each one of the plurality of sensors is laterally surrounded by and is directly adjacent to three or more applicators of the array of applicators from a plan view perspective, and wherein one or more individual ones of the array of applicators is laterally surrounded by and is directly adjacent to three sensors of the plurality of sensors from the plan view perspective.

2. The plasma processing tool of claim 1, wherein the plurality of sensors comprise plasma sensors, and wherein feedback control data for each microwave amplification module is provided by one or more of the plurality of plasma sensors.

3. The plasma processing tool of claim 2, wherein the feedback control of the microwave amplification module comprises multi-input multi-output (MIMO) control.

4. The plasma processing tool of claim 1, wherein the microwave amplification module further comprises a phase-shifter.

5. The plasma processing tool of claim 1, wherein the microwave amplification module operates in a pulsed mode.

6. The plasma processing tool of claim 1, wherein a cross-section of the applicator is circular.

7. The plasma processing tool of claim 1, wherein a cross-section of the applicator is rectangular.

8. The plasma processing tool of claim 1, wherein a cross-section of the applicator is a symmetrical polygon.

9. The plasma processing tool of claim 1 further comprising an impedance tuning backshort.

10. The plasma processing tool of claim 9, wherein the applicator is a dielectric resonator, wherein the dielectric resonator comprises:

dielectric resonant cavity, wherein the dielectric resonant cavity comprises a top surface, an outer sidewall surface and, a bottom surface opposite from the top surface;

an applicator housing formed around the outer sidewall surface of the dielectric resonant cavity;

and wherein the backshort has a top surface that at least partially faces the top surface of the dielectric resonant cavity so that a space is defined between the backshort and the dielectric resonant cavity, and wherein the backshort is arranged about at least a portion of the applicator housing and is configured to be repositioned along the applicator housing to change a distance between the top surface of the backshort and the top surface of the dielectric resonant cavity to adjust the space and thereby change an impedance of the applicator.

11. A semiconductor processing tool, comprising:

a chamber, wherein the chamber comprises a plurality of processing zones;

a voltage control circuit;

a voltage controlled oscillator, wherein an output voltage from the voltage control circuit drives oscillation in the voltage controlled oscillator;

a plurality of modular microwave sources coupled to one or more of the processing zones, wherein each modular microwave source comprises:

a solid state microwave amplification module coupled to the voltage controlled oscillator, wherein the solid state microwave amplification module amplifies an output from the voltage controlled oscillator; and an applicator coupled to the solid state microwave amplification module, wherein the applicator is a dielectric resonator; and a plurality of sensors positioned among the applicators, wherein each one of the plurality of sensors is laterally surrounded by and is directly adjacent to three or more applicators of the array of applicators from a plan view perspective, and wherein one or more individual ones of the array of applicators is laterally surrounded by and is directly adjacent to three sensors of the plurality of sensors from the plan view perspective.

12. The plasma processing tool of claim 11, wherein each of the microwave amplification modules are independently controllable.

13. The plasma processing tool of claim 11, wherein the plurality of sensors comprise plasma sensors, and wherein feedback control data for each microwave amplification module is provided by one or more of the plurality of plasma sensors.

14. The plasma processing tool of claim 13, wherein the feedback control of the microwave amplification module comprises multi-input multi-output (MIMO) control.

\* \* \* \* \*